United States Patent
Barve et al.

(10) Patent No.: US 12,362,541 B2
(45) Date of Patent: Jul. 15, 2025

(54) METHODS FOR INCORPORATING A CONTROL STRUCTURE WITHIN A VERTICAL CAVITY SURFACE EMITTING LASER DEVICE CAVITY

(71) Applicant: Lumentum Operations LLC, San Jose, CA (US)

(72) Inventors: Ajit Vijay Barve, San Jose, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 605 days.

(21) Appl. No.: 17/364,301

(22) Filed: Jun. 30, 2021

(65) Prior Publication Data
US 2022/0352693 A1  Nov. 3, 2022

Related U.S. Application Data

(60) Provisional application No. 63/182,534, filed on Apr. 30, 2021.

(51) Int. Cl.
*H01S 5/183*  (2006.01)
*H01S 5/30*  (2006.01)

(52) U.S. Cl.
CPC ...... *H01S 5/18377* (2013.01); *H01S 5/18355* (2013.01); *H01S 5/18358* (2013.01); *H01S 5/18319* (2013.01); *H01S 5/3095* (2013.01); *H01S 2304/02* (2013.01); *H01S 2304/04* (2013.01)

(58) Field of Classification Search
CPC ............. H01S 2304/04; H01S 2304/02; H01S 5/18319
See application file for complete search history.

(56) References Cited

U.S. PATENT DOCUMENTS 5,432,812 A * 7/1995 Kurobe .................. H01S 5/227
372/45.01
5,594,751 A * 1/1997 Scott .................... H01S 5/18333
372/92

(Continued)

FOREIGN PATENT DOCUMENTS

CN    111834890 A * 10/2020 ......... H01S 5/04254
EP     1811620 A2 * 7/2007 ............. B82Y 20/00

(Continued)

*Primary Examiner* — Joshua King
(74) *Attorney, Agent, or Firm* — Harrity & Harrity, LLP

(57) ABSTRACT

A method of incorporating a control structure within a VCSEL device cavity using a multiphase growth sequence includes forming a first mirror over a substrate, forming an active region over the first mirror, forming a spacer on a surface of the active region, forming a control structure on a surface of the spacer, and forming a second mirror over the control structure. The active region and the spacer are formed using a molecular beam epitaxy (MBE) process during an MBE phase of the multiphase growth sequence. The second mirror is formed using a metal-organic chemical vapor deposition (MOCVD) process during an MOCVD phase of the multiphase growth sequence. The control structure is formed using a chemical etching process during a transition period between the MBE phase and the MOCVD phase of the multiphase growth sequence.

20 Claims, 4 Drawing Sheets

(56) References Cited

U.S. PATENT DOCUMENTS

| | | | | |
|---|---|---|---|---|
| 5,732,103 A | * | 3/1998 | Ramdani | H01S 5/18341 372/92 |
| 5,818,066 A | * | 10/1998 | Duboz | H01S 5/18386 257/E31.127 |
| 5,917,848 A | * | 6/1999 | Claisse | H01S 5/18391 372/50.1 |
| 6,061,381 A | * | 5/2000 | Adams | G02B 6/4471 372/50.11 |
| 6,487,230 B1 | * | 11/2002 | Boucart | H01S 5/426 372/45.01 |
| 6,487,231 B1 | * | 11/2002 | Boucart | H01S 5/426 372/45.01 |
| 6,535,538 B1 | * | 3/2003 | Lee | H01S 5/0264 372/39 |
| 6,608,849 B2 | * | 8/2003 | Mawst | H01S 5/423 372/43.01 |
| 7,412,170 B1 | * | 8/2008 | Louderback | H01S 5/423 398/79 |
| 2001/0043629 A1 | * | 11/2001 | Sun | H01S 5/426 257/E33.069 |
| 2001/0046249 A1 | * | 11/2001 | Streubel | H01S 5/18341 372/96 |
| 2002/0094004 A1 | * | 7/2002 | Furukawa | H01S 5/18397 372/46.01 |
| 2002/0150135 A1 | * | 10/2002 | Naone | H01S 5/18369 372/45.011 |
| 2003/0016714 A1 | * | 1/2003 | Streubel | H01S 5/18341 372/46.013 |
| 2003/0156616 A1 | * | 8/2003 | Kwon | B82Y 20/00 372/96 |
| 2003/0157739 A1 | * | 8/2003 | Jiang | H01S 5/18313 257/E21.097 |
| 2004/0105476 A1 | * | 6/2004 | Wasserbauer | H01S 5/026 372/50.22 |
| 2004/0264531 A1 | * | 12/2004 | Ryou | B82Y 20/00 372/45.01 |
| 2005/0040413 A1 | * | 2/2005 | Takahashi | B82Y 20/00 257/96 |
| 2006/0187997 A1 | * | 8/2006 | Ezaki | H01S 5/18355 372/99 |
| 2007/0002917 A1 | * | 1/2007 | Deng | H01S 5/18302 372/50.1 |
| 2007/0258499 A1 | * | 11/2007 | Mochizuki | H01S 5/04253 372/50.1 |
| 2008/0212633 A1 | * | 9/2008 | Shimizu | B82Y 20/00 372/45.011 |
| 2010/0128749 A1 | * | 5/2010 | Amann | H01S 5/18308 257/E21.085 |
| 2011/0027925 A1 | * | 2/2011 | Ikuta | H01S 5/18311 372/45.01 |
| 2012/0051384 A1 | * | 3/2012 | Geske | H01S 5/18305 372/50.124 |
| 2013/0177336 A1 | * | 7/2013 | Ikuta | H01S 3/02 399/221 |
| 2016/0156154 A1 | * | 6/2016 | Fuchida | H01S 3/1055 372/50.11 |
| 2017/0214218 A1 | * | 7/2017 | Tan | H01S 5/0267 |
| 2018/0241177 A1 | * | 8/2018 | Wong | H01S 5/3095 |
| 2019/0181615 A1 | * | 6/2019 | Choi | H01S 5/426 |
| 2020/0073029 A1 | * | 3/2020 | Han | G02B 5/3058 |
| 2020/0403376 A1 | * | 12/2020 | Weichmann | H01S 5/0421 |
| 2022/0209501 A1 | * | 6/2022 | Zhao | H01S 5/343 |
| 2022/0209502 A1 | * | 6/2022 | Chen | H01S 5/18377 |
| 2022/0209506 A1 | * | 6/2022 | Kesler | H01S 5/18325 |
| 2022/0416506 A1 | * | 12/2022 | Yu | H01S 5/1838 |

FOREIGN PATENT DOCUMENTS

| | | | | |
|---|---|---|---|---|
| EP | 3496216 A1 | * | 6/2019 | H01S 5/0421 |
| JP | 2004529487 A | * | 9/2004 | |
| JP | 3697903 B2 | * | 9/2005 | H01S 5/18361 |
| TW | I242919 B | * | 11/2005 | |
| WO | WO-9921252 A1 | * | 4/1999 | H01S 5/18308 |
| WO | WO-2011148957 A1 | * | 12/2011 | B41J 2/442 |
| WO | WO-2013005813 A1 | * | 1/2013 | B82Y 20/00 |

* cited by examiner

METHODS FOR INCORPORATING A CONTROL STRUCTURE WITHIN A VERTICAL CAVITY SURFACE EMITTING LASER DEVICE CAVITY

RELATED APPLICATION

This application claims priority to U.S. Provisional Patent Application No. 63/182,534, entitled "Mode Control in a Short-Wave Infrared Vertical Cavity Surface Emitting Laser," filed on Apr. 30, 2021, the content of which is incorporated by reference herein in its entirety.

TECHNICAL FIELD

The present disclosure relates generally to a vertical cavity surface emitting laser (VCSEL) and to methods for incorporating a control structure within a VCSEL device cavity.

BACKGROUND

A vertical-emitting laser device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

In some implementations, a method of forming a VCSEL device using a multiphase growth sequence includes forming a first mirror over a substrate; forming an active region over the first mirror; forming a spacer on a surface of the active region; forming a control structure on a surface of the spacer; and forming a second mirror over the control structure, wherein: the active region and the spacer are formed using a molecular beam epitaxy (MBE) process during an MBE phase of the multiphase growth sequence; the second mirror is formed using a metal-organic chemical vapor deposition (MOCVD) process during an MOCVD phase of the multiphase growth sequence; and the control structure is formed using a chemical etching process during a transition period between the MBE phase and the MOCVD phase of the multiphase growth sequence.

In some implementations, a method of forming a VCSEL device using a multiphase growth sequence includes forming a first mirror over a substrate; forming an active region over the first mirror; forming a spacer on a surface of the active region; forming a control structure on a surface of the spacer; and forming a second mirror over the control structure, wherein: the active region and the spacer are formed using an MBE process during an MBE phase of the multiphase growth sequence; the second mirror is formed using an MOCVD process during an MOCVD phase of the multiphase growth sequence; the control structure is formed using a chemical etching process during a transition period between the MBE phase and the MOCVD phase of the multiphase growth sequence; and the control structure is configured to provide mode control within a cavity of the VCSEL device.

In some implementations, a method of forming a VCSEL device using a multiphase growth sequence includes forming a first mirror over a substrate; forming an active region over the first mirror; forming a spacer on a surface of the active region; forming a control structure on a surface of the spacer; and forming a second mirror over the control structure, wherein: the active region, the spacer, and the control structure are formed using an MBE process during an MBE phase of the multiphase growth sequence; the second mirror is formed using an MOCVD process during an MOCVD phase of the multiphase growth sequence; the control structure is further formed using a chemical etching process during a transition period between the MBE phase and the MOCVD phase of the multiphase growth sequence; and the control structure is configured to provide optical confinement and current confinement within a cavity of the VCSEL device.

DETAILED DESCRIPTION

Figure 1:
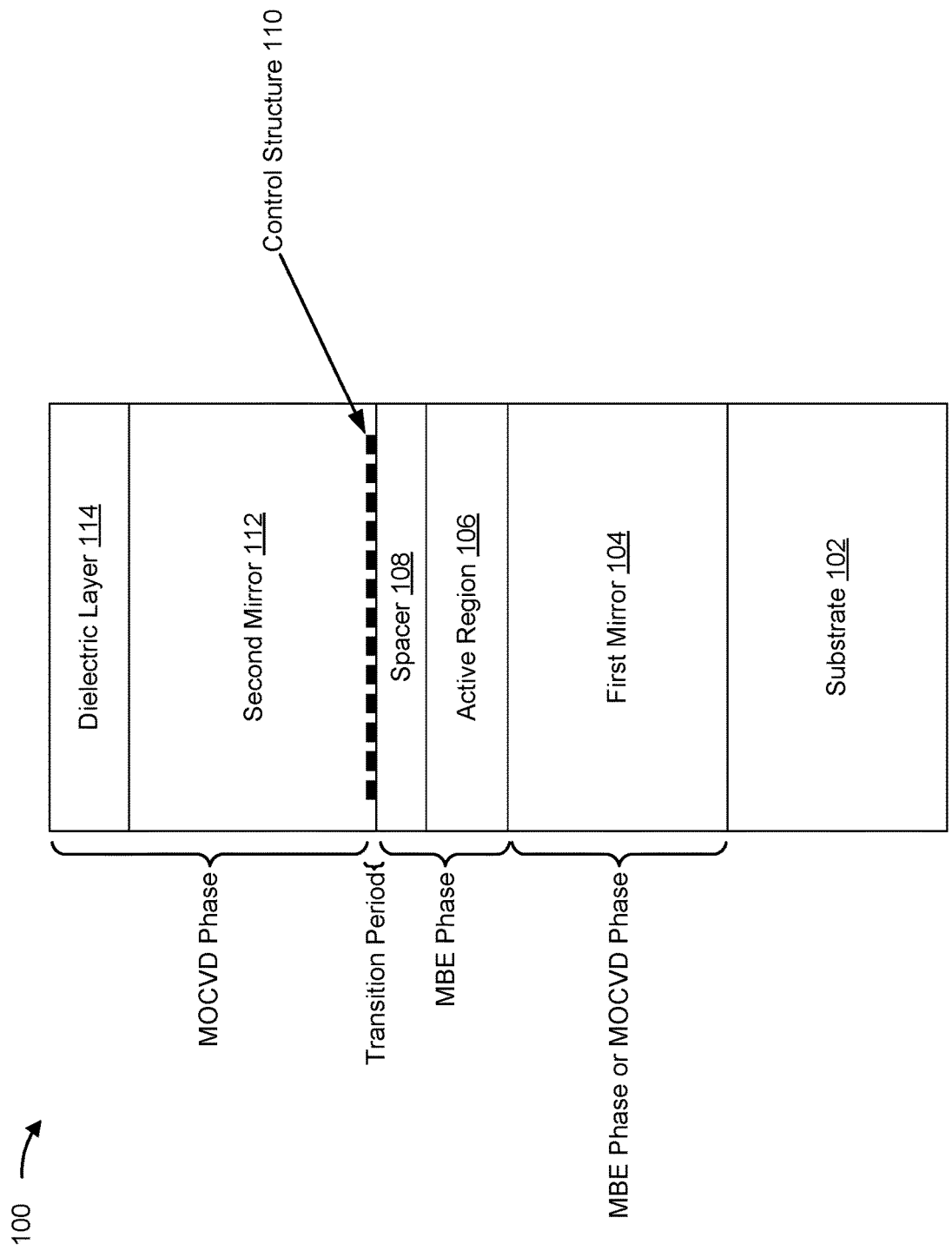
FIG. 1 is a diagram of an example vertical cavity surface emitting laser (VCSEL) device described herein.

The following detailed description of example implementations refers to the accompanying drawings. The same reference numbers in different drawings may identify the same or similar elements.

A conventional laser device may be created by depositing different material layers on a substrate. For example, a single deposition process (e.g., a metal-organic chemical vapor deposition (MOCVD) process or a molecular beam epitaxy (MBE) process) may be used to form a set of reflectors and an active region on a substrate. Often, however, the deposition process may be suitable for forming some layers, such as reflectors, but not for others, such as an active region (or vice versa). In some cases, this creates low quality layers and/or structures within the conventional laser device, which introduces defects or allows defects to propagate through the conventional laser device. This can degrade a performance, manufacturability, and/or a reliability of the conventional laser device.

Further, in some cases, a vertical cavity surface emitting laser (VCSEL) may be used for three-dimensional sensing (3DS) applications. When used in this way, mode stability across the VCSEL is important. For example, some 3DS applications require a fixed polarization mode. However, a VCSEL typically supports multiple spatial modes that are each associated with two polarization modes that have similar gains. Therefore, the VCSEL intermittently switches between the two polarization modes as a function of bias current, temperature, or stress associated with the VCSEL. In some cases, a spatial mode filter can be included on an emission area of the VCSEL to stabilize a polarization mode of the VCSEL. However, this reduces a power of an output beam of the VCSEL because the lasing modes are filtered outside a laser cavity of the VCSEL.

Some implementations described herein provide a multiphase growth sequence for forming a VCSEL. In some implementations, the multiphase growth sequence includes forming, on a substrate, a first set of layers and/or structures using a first MOCVD process during a first MOCVD phase, a second set of layers and/or structures using an MBE process during an MBE phase, and a third set of layers and/or structures using a second MOCVD process during a second MOCVD phase. The first set of layers and/or structures may include a first mirror, the second set of layers and/or structures may include an active region (e.g., a dilute nitride active region), and the third set of layers and/or structures may include a second mirror. The multiphase growth sequence also includes forming a control structure (e.g., to provide mode control, optical confinement, and/or current confinement with a cavity of the VCSEL device) during a transition period between the MBE phase and the second MOCVD phase. In some implementations, the multiphase growth sequence includes forming, on a substrate, a first set of layers and/or structures using an MBE process during an MBE phase and a second set of layers and/or structures using an MOCVD process during an MOCVD phase. The first set of layers and/or structures may include a first mirror and an active region (e.g., a dilute nitride active region), and the second set of layers and/or structures may include a second mirror. The multiphase growth sequence also includes forming a control structure (e.g., to provide mode control, optical confinement, and/or current confinement within a cavity of the VCSEL device) during a transition period between the MBE phase and the MOCVD phase.

In this way, using a multiphase growth sequence enables formation of high-quality layers and/or structures within the VCSEL device. For example, an MOCVD process, which forms high quality mirrors (e.g., high quality distributed Bragg reflectors (DBRs)), is used during an MOCVD phase to form the first mirror and/or the second mirror. As another example, an MBE process, which forms high quality active regions (e.g., high quality active regions with dilute nitride quantum wells and/or indium gallium arsenide (InGaAs) quantum dot layers), is used during an MBE phase to form the active region. Accordingly, creation of high-quality layers and/or structures within the VCSEL device reduces a likelihood of defects or a propagation of defects through the VCSEL device. Therefore, using a multiphase growth sequence to form a VCSEL device improves a performance, manufacturability, and/or a reliability of the VCSEL device, as compared to a VCSEL device formed using a single deposition process.

Moreover, the control structure is formed during a transition period between an MBE phase and an MOCVD phase of the multiphase growth sequence, and therefore no additional time is needed to stop a formation process to enable formation of the control structure. Further, forming the control structure during the transition period enables the control structure to be incorporated within a cavity of the VCSEL device (e.g., near the active region). Accordingly, because the control structure is located within the cavity of the VCSEL device, the control structure causes the VCSEL device to promote emission of an output beam with a preferred polarization mode and to attenuate emission of a non-preferred polarization mode. In this way, the control structure may stabilize a polarization mode of the VCSEL device. Further, this increases a power of the output beam as compared to using a spatial mode filter that is external to the cavity of the VCSEL device.

FIG. 1 is a diagram of an example VCSEL device 100 described herein. The VCSEL device 100 may include, for example, a short-wave infrared (SWIR) VCSEL device, an oxide confined VCSEL device, an implant confined VCSEL device, a mesa confined VCSEL device, a top emitting VCSEL device, or a bottom emitting VCSEL device. In some implementations, the VCSEL device 100 may be configured to emit an output beam (e.g., an output laser beam). For example, the device may be configured to emit an output beam that has a wavelength in a near-infrared range (e.g., the wavelength of the output beam is in a range of 1200-1600 nanometers). As shown in FIG. 1, the VCSEL device 100 may include a substrate 102, a first mirror 104, an active region 106, a spacer 108, a control structure 110, a second mirror 112, and/or a dielectric layer 114.

The substrate 102 may include a substrate upon which other layers and/or structures shown in FIG. 1 are grown. The substrate 102 may include a semiconductor material, such as gallium arsenide (GaAs), indium phosphide (InP), germanium (Ge), and/or another type of semiconductor material. In some implementations, the substrate may be an n-doped substrate, such as an n-type GaAs substrate, an n-type InP substrate, or an n-type Ge substrate.

The first mirror 104 may be disposed over the substrate 102. For example, the first mirror 104 may be disposed on (e.g., directly on) a surface of the substrate 102 or on one or more intervening layers or structures (e.g., one or more spacers, one or more cladding layers, and/or other examples) between the substrate 102 and the first mirror 104. The first mirror 104 may include a reflector, such as a dielectric distributed Bragg reflector (DBR) or a semiconductor DBR. For example, the first mirror 104 may include a set of alternating semiconductor layers, such as a set of alternating GaAs layers and aluminum gallium arsenide (AlGaAs) layers or a set of alternating AlGaAs layers with a low aluminum (Al) percentage and AlGaAs layers with a high Al percentage. In some implementations, the first mirror 104 may be an n-doped mirror (e.g., an n-doped DBR). For example, the first mirror 104 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The active region 106 may be disposed over the first mirror 104. For example, the active region 106 may be disposed on (e.g., directly on) a surface of the first mirror 104 or on one or more intervening layers (e.g., one or more spacers, one or more cladding layers, and/or other examples) between the first mirror 104 and the active region 106. The active region 106 may include one or more layers where electrons and holes recombine to emit light (e.g., as an output beam) and define an emission wavelength range of the VCSEL device 100. For example, the active region 106 may include one or more quantum wells, such as at least one dilute nitride quantum well (e.g., a gallium indium nitride arsenide (GaInNAs) quantum well and/or a gallium indium nitride arsenide antimonide (GaInNAsSb) quantum well), and/or one or more quantum dot layers, such as at least one indium gallium arsenide (InGaAs) quantum dot layer.

The spacer 108 may be disposed over the active region 106. For example, the spacer 108 may be disposed on (e.g., directly on) a surface of the active region 106 or on one or more intervening layers (e.g., one or more spacers, one or more cladding layers, and/or other examples) between the active region 106 and the spacer 108. In some implementations, the spacer 108 may include one or more undoped semiconductor layers, such as one or more undoped GaAs layers, and/or one or more p-doped semiconductor layers, such as one or more p-doped GaAs (p-GaAs) layers. The spacer 108 may be configured to align a standing wave of an optical field of the VCSEL device 100 with an interface between the spacer 108 and the control structure 110 and/or the second mirror 112. For example, a thickness of the spacer 108 may have a thickness that is equal to (e.g., within a tolerance) an odd multiple of a quarter wavelength ($\lambda$) of the standing wave, such that the thickness of the spacer 108 may be ¼λ, ¾λ, or 5/4λ and so on. In this way, the thickness of the spacer 108 may cause the interface to coincide with a local minimum of the standing wave of the optical field of the VCSEL device 100.

The control structure 110 may be disposed over the spacer 108. For example, the control structure 110 may be disposed on (e.g., directly on) a surface of the spacer 108 or on one or more intervening layers (e.g., one or more spacers, one or more cladding layers, and/or other examples) between the spacer 108 and the control structure 110. The control structure 110 may be configured to provide mode control within a cavity of the VCSEL device 100 (e.g., between the spacer 108 and the second mirror 112). For example, the control structure 110 may cause the VCSEL device 100 to promote emission of an output beam associated with a first polarization mode and/or to attenuate emission of an output beam that is not associated with a second polarization mode (e.g., the VCSEL device 100 may prefer the first polarization mode and/or may attenuate the second polarization mode). In some implementations, the control structure 110 may include a one-dimensional grating, a two-dimensional grating, a sub-wavelength grating (e.g., a sub-λ grating), a diffuser, a round aperture, a polygonal-shaped aperture, and/or an elliptical aperture.

The second mirror 112 may be disposed over the control structure 110. For example, the second mirror 112 may be disposed on (e.g., directly on) a surface of the control structure 110 or on one or more intervening layers (e.g., one or more spacers, one or more cladding layers, and/or other examples) between the control structure 110 and the second mirror 112. The second mirror 112 may include a reflector, such as a dielectric DBR or a semiconductor DBR. For example, the second mirror 112 may include a set of alternating semiconductor layers, such as a set of alternating GaAs layers and AlGaAs layers or a set of alternating AlGaAs layers with a low Al percentage and AlGaAs layers with a high Al percentage. In some implementations, the second mirror 112 may be a p-doped mirror (e.g., a p-doped DBR). For example, the second mirror 112 may include a set of alternating p-doped GaAs (p-GaAs) layers and p-doped AlGaAs (p-AlGaAs) layers or a set of alternating p-doped AlGaAs layers with a low Al percentage (low Al p-AlGaAs) and p-doped AlGaAs layers with a high Al percentage (high Al p-AlGaAs).

The dielectric layer 114 may be disposed over the second mirror 112. For example, the dielectric layer 114 may be disposed on (e.g., directly on) a surface of the second mirror 112 or on one or more intervening layers (e.g., one or more spacers, one or more cladding layers, and/or other examples) between the second mirror 112 and the dielectric layer 114. The dielectric layer 114 may provide electrical isolation for the VCSEL device 100 and/or may facilitate emission of the output beam from a surface (e.g., a top surface) of the VCSEL device 100. In some implementations, the dielectric layer 114 may comprise a non-conductive material, such as a polymer, a polyamide, and/or another type of dielectric material.

In some implementations, the VCSEL device 100 may be formed using a multiphase growth sequence, as described herein. For example, as shown in FIG. 1, the first mirror 104 may be formed using a first MOCVD process (also referred to as a metal-organic vapor phase epitaxy (MOVPE) process) during a first MOCVD phase of the multiphase growth sequence, and the active region 106 and the spacer 108 may be formed using an MBE process (e.g., that utilizes nitrogen gas ($N_2$)) during an MBE phase of the multiphase growth sequence. The control structure 110 may be formed (e.g., using a chemical etching process, such as on a surface of the spacer 108) during a transition period between the MBE phase and a second MOCVD phase of the multiphase growth sequence (e.g., when the MBE phase occurs before the second MOCVD phase). The second mirror 112 and the dielectric layer 114 may be formed using a second MOCVD process (e.g., that is the same as or different than the first MOCVD process) during the second MOCVD phase. As another example, the first mirror 104, the active region 106, and the spacer 108 may be formed using an MBE process during an MBE phase, the control structure 110 may be formed during a transition period between the MBE phase and an MOCVD phase (e.g., when the MBE phase occurs before the MOCVD phase), and the second mirror 112 and the dielectric layer 114 may be formed using an MOCVD process during the MOCVD phase.

As indicated above, FIG. 1 is provided as an example. Other examples may differ from what is described with regard to FIG. 1. In practice, the VCSEL device 100 may include additional layers and/or elements, fewer layers and/or elements, different layers and/or elements, or differently arranged layers and/or elements than those shown in FIG. 1.

Figure 2:
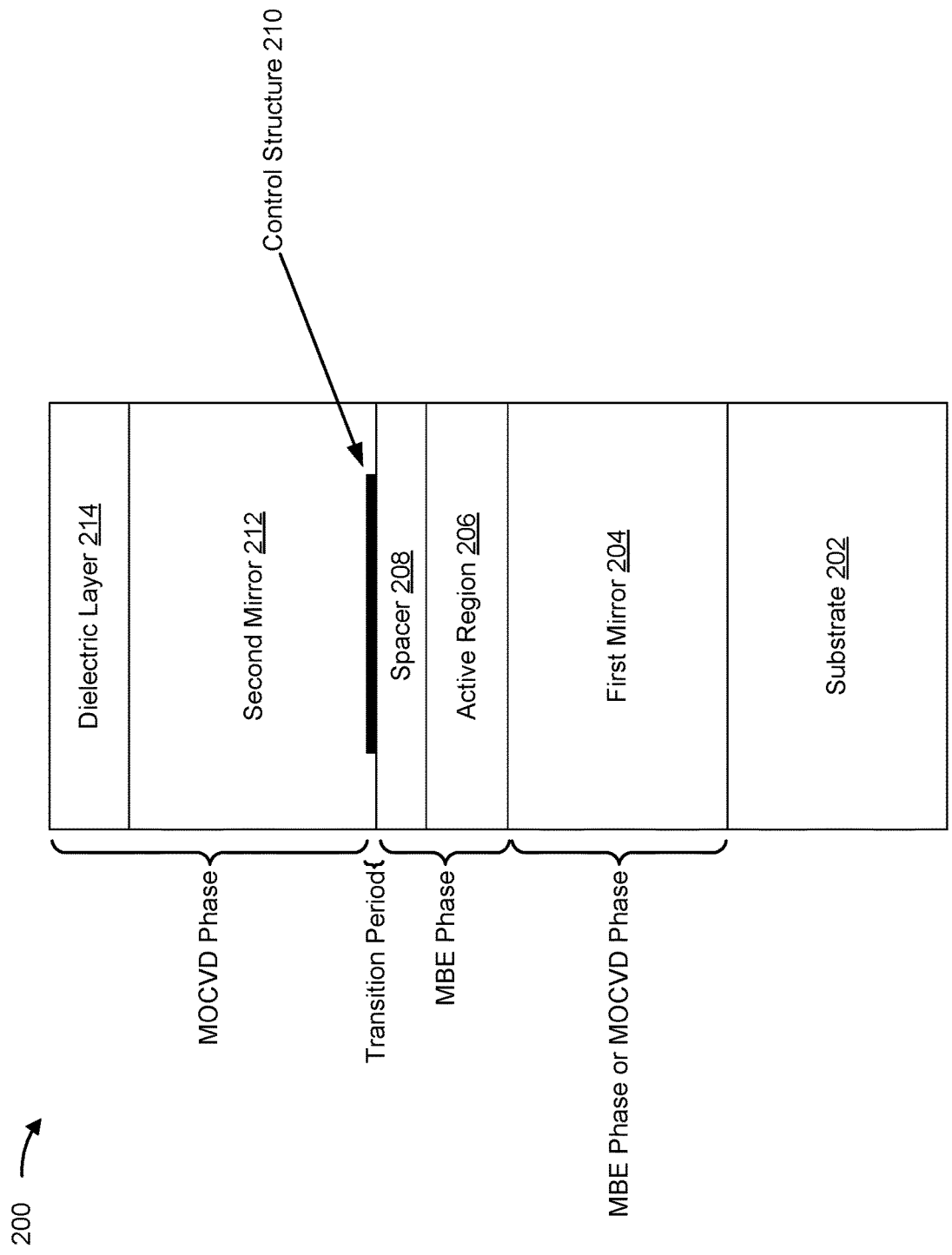
FIG. 2 is a diagram of another example VCSEL device described herein.

FIG. 2 is a diagram of an example VCSEL device 200 described herein. The VCSEL device 200 may include, for example, a SWIR VCSEL device, an oxide confined VCSEL device, an implant confined VCSEL device, a mesa confined VCSEL device, a top emitting VCSEL device, or a bottom emitting VCSEL device. In some implementations, the VCSEL device 200 may be configured to emit an output beam (e.g., an output laser beam). For example, the device may be configured to emit an output beam that has a wavelength in a near-infrared range (e.g., the wavelength of the output beam is in a range of 1200-1600 nanometers). As shown in FIG. 2, the VCSEL device 100 may include a substrate 202, a first mirror 204, an active region 206, a spacer 208, a control structure 210, a second mirror 212, and/or a dielectric layer 214.

The substrate 202 may include a substrate upon which other structures shown in FIG. 2 are grown. The substrate 202 may be the same as, or similar to, the substrate 102 described in relation to FIG. 1. For example, the substrate 202 may include a semiconductor material, such as GaAs, InP, Ge, and/or another type of semiconductor material. In some implementations, the substrate may be an n-doped substrate, such as an n-type GaAs substrate, an n-type InP substrate, or an n-type Ge substrate.

The first mirror 204 may be disposed over the substrate 202. For example, the first mirror 204 may be disposed on (e.g., directly on) a surface of the substrate 202 or on one or more intervening layers between the substrate 202 and the first mirror 204. The first mirror 204 may be the same as, or similar to, the first mirror 104 described in relation to FIG. 1. For example, the first mirror 204 may include a reflector, such as a dielectric DBR mirror, that includes a set of alternating dielectric layers or a semiconductor DBR that includes a set of alternating GaAs layers and AlGaAs layers. In some implementations, the first mirror 204 may be an n-doped mirror (e.g., an n-doped DBR). For example, the first mirror 204 may include a set of alternating n-doped GaAs (n-GaAs) layers and n-doped AlGaAs (n-AlGaAs) layers.

The active region 206 may be disposed over the first mirror 204. For example, the active region 206 may be disposed on (e.g., directly on) a surface of the first mirror 204 or on one or more intervening layers between the first mirror 204 and the active region 206. The active region 206 may be the same as, or similar to, the active region 106 described in relation to FIG. 1. For example, the active region 206 may include one or more quantum wells, such as at least one dilute nitride quantum well (e.g., a GaInNAs quantum well and/or a GaInNAsSb quantum well), and/or one or more quantum dot layers, such as at least one InGaAs quantum dot layer.

The spacer 208 may be disposed over the active region 206. For example, the spacer 208 may be disposed on (e.g., directly on) a surface of the active region 206 or on one or more intervening layers between the active region 206 and the spacer 208. The spacer 208 may be the same as, or similar to, the spacer 108 described in relation to FIG. 1. For example, the spacer 208 may include one or more undoped semiconductor layers, such as one or more undoped GaAs layers, and/or one or more p-doped semiconductor layers, such as one or more p-doped GaAs (p-GaAs) layers.

The control structure 210 may be disposed over the spacer 208. For example, the control structure 210 may be disposed on (e.g., directly on) a surface of the spacer 208 or on one or more intervening layers between the spacer 208 and the control structure 210. In some implementations, the control structure 210 may be a buried tunnel junction and may include a set of highly doped alternating semiconductor layers, such as a set of alternating highly n-doped semiconductor layers and highly p-doped semiconductor layers. For example, the control structure 210 may include a set of alternating highly n-doped GaAs (n--GaAs) layers and highly p-doped AlGaAs (p+-AlGaAs) layers or a set of alternating highly p-doped GaAs (p+-GaAs) layers and highly n-doped AlGaAs (n--AlGaAs) layers. In some implementations, the control structure 210 may be configured to provide optical confinement within a cavity of the VCSEL device 200 (e.g., between the active region 206 and the dielectric layer 214). For example, the control structure 210 may comprise an n-doped semiconductor layer (e.g., that is formed on a surface of the spacer 208) and the n-doped semiconductor layer may be etched to cause in-phase reflection (also referred to as "guiding") of the optical beam in a central portion of the n-doped semiconductor layer and/or to cause out-of-phase reflection (also referred to as "antiguiding") of the optical beam in other portions of the n-doped semiconductor layer. Additionally, or alternatively, the control structure 210 may be configured to provide current confinement within the cavity of the VCSEL device 200. For example, the control structure 210 may comprise an n-doped semiconductor layer (e.g., that is formed on a surface of the spacer 208) and the n-doped semiconductor layer may be etched to create a low resistance path in a central portion of the n-doped semiconductor layer and/or to create a high resistance path in other portions of the n-doped semiconductor layer.

The second mirror 212 may be disposed over the control structure 210. For example, the second mirror 212 may be disposed on (e.g., directly on) a surface of the control structure 210 or on one or more intervening layers between the control structure 210 and the second mirror 212. The second mirror 212 may be the same as, or similar to, the second mirror 112 described in relation to FIG. 1. For example, the second mirror 212 may include a reflector, such as a dielectric DBR mirror that includes a set of alternating dielectric layers or a semiconductor DBR that includes a set of alternating GaAs layers and AlGaAs layers. In some implementations, the second mirror 212 may be an n-doped mirror (e.g., an n-doped DBR). For example, the second mirror 212 may include a set of alternating n-doped GaAs (n-GaAs) layers and n-doped AlGaAs (n-AlGaAs) layers.

The dielectric layer 214 may be disposed over the second mirror 212. For example, the dielectric layer 214 may be disposed on (e.g., directly on) a surface of the second mirror 212 or on one or more intervening layers (e.g., one or more spacers, one or more cladding layers, and/or other examples) between the second mirror 212 and the dielectric layer 214. The dielectric layer 214 may be the same as, or similar to, the dielectric layer 114 described in relation to FIG. 1. For example, the dielectric layer 214 may provide electrical isolation for the VCSEL device 200 and/or may facilitate emission of the output beam from a surface (e.g., a top surface) of the VCSEL device 200. In some implementations, the dielectric layer 214 may comprise a non-conductive material, such as a polymer, a polyamide, and/or another type of dielectric material.

In some implementations, the VCSEL device 200 may be formed using a multiphase growth sequence, as described herein. For example, as shown in FIG. 2, the first mirror 204 may be formed using a first MOCVD process during a first MOCVD phase of the multiphase growth sequence, and the active region 206 and the spacer 208 may be formed using an MBE process (e.g., that utilizes nitrogen gas ($N_2$)) during an MBE phase of the multiphase growth sequence. The control structure 210 may be formed (e.g., using a chemical etching process, such as on a surface of the spacer 208) during a transition period between the MBE phase and a second MOCVD phase of the multiphase growth sequence (e.g., when the MBE phase occurs before the second MOCVD phase). The second mirror 212 and the dielectric layer 214 may be formed using a second MOCVD process (e.g., that is the same as or different than the first MOCVD process) during the second MOCVD phase. As another example, the first mirror 204, the active region 206, and the spacer 208 may be formed using an MBE process during an MBE phase, the control structure 210 may be formed during a transition period between the MBE phase and an MOCVD phase (e.g., when the MBE phase occurs before the MOCVD phase), and the second mirror 212 and the dielectric layer 214 may be formed using an MOCVD process during the MOCVD phase.

As indicated above, FIG. 2 is provided as an example. Other examples may differ from what is described with regard to FIG. 2. In practice, the VCSEL device 200 may include additional layers and/or elements, fewer layers and/or elements, different layers and/or elements, or differently arranged layers and/or elements than those shown in FIG. 2.

Figure 3:
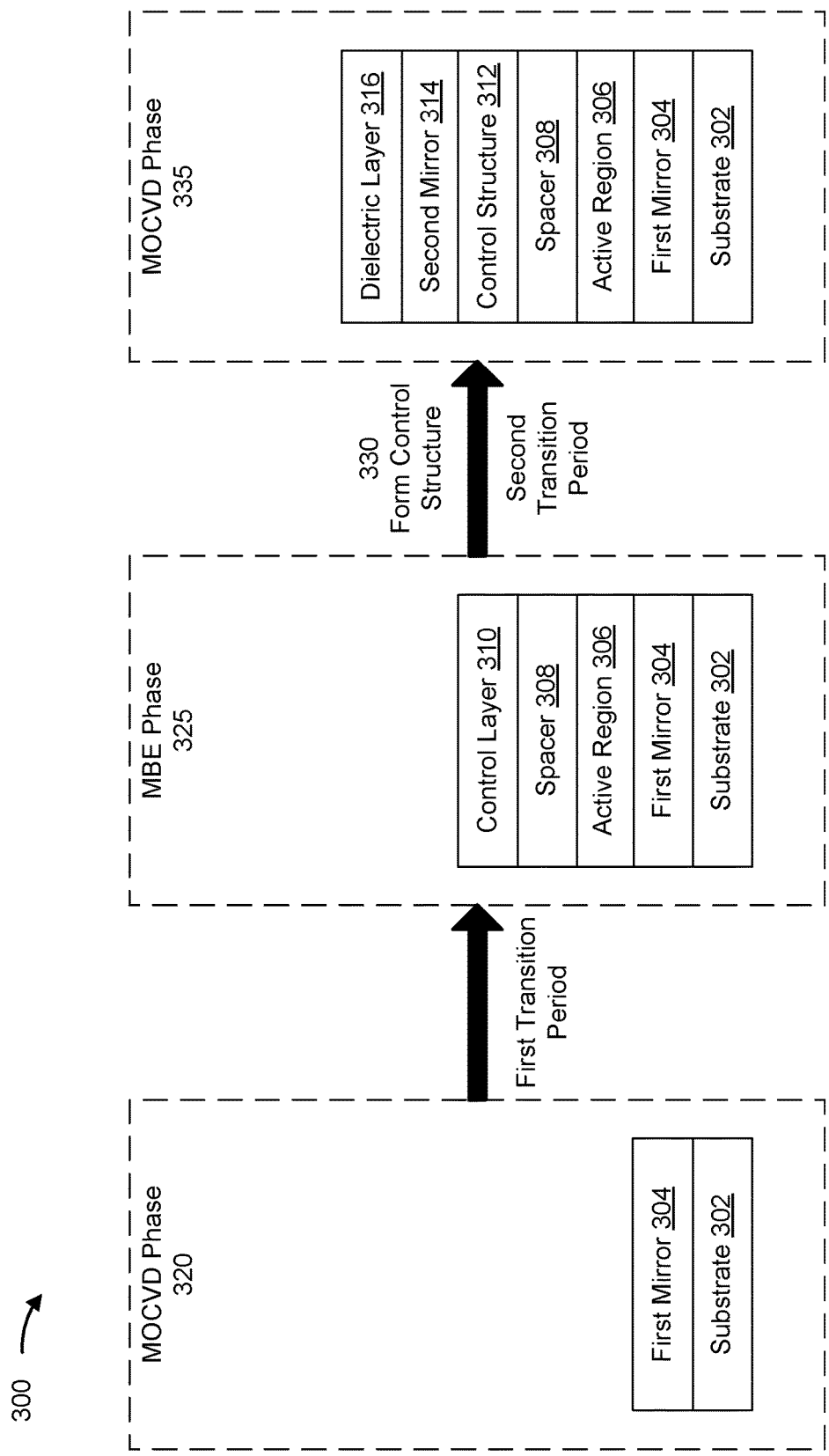
FIG. 3 is a diagram of an example implementation of a multiphase growth sequence for forming a VCSEL device.

FIG. 3 is a diagram of an example implementation 300 of a multiphase growth sequence for forming a VCSEL device (e.g., a VCSEL device that is the same as, or similar to, the VCSEL device 100 or the VCSEL device 200 described in relation to FIGS. 1-2). As shown in FIG. 3, the VCSEL device may be formed by forming a substrate 302, a first mirror 304, an active region 306, a spacer 308, a control layer 310, a control structure 312, a second mirror 314, and/or a dielectric layer 316. The substrate 302, the first mirror 304, the active region 306, the spacer 308, the control structure 312, the second mirror 314, and/or the dielectric layer 316 may be the same as, or similar to, corresponding structures and/or layers described herein in relation to FIGS. 1-2.

As shown in FIG. 3, the multiphase growth sequence may include a first MOCVD phase 320. During the first MOCVD phase 320, a first MOCVD process may be used to form one or more layers of an epitaxial structure (e.g., that will become the VCSEL device). For example, as shown in FIG. 3, the first MOCVD process may be used to form the first mirror 304 over the substrate 302.

As further shown in FIG. 3, after the first MOCVD phase 320 has finished, the multiphase growth sequence may include a first transition period (e.g., a time after the first MOCVD phase 320 and before an MBE phase 325). For example, during the first transition period, the epitaxial structure formed by the first MOCVD phase 320 may be physically moved from an MOCVD processing environment (e.g., that is used during the first MOCVD phase 320) to an MBE processing environment (e.g., that is used during the MBE phase 325).

As further shown in FIG. 3, the multiphase growth sequence may include the MBE phase 325. During the MBE phase 325, an MBE process may be used to form one or more of the layers of the epitaxial structure (e.g., on the substrate 302). For example, as shown in FIG. 3, the MBE process may be used to form the active region 306 over the first mirror 304, the spacer 308 over the active region 306, and/or the control layer 310 over the spacer 308. The control layer 310 may include one or more undoped semiconductor layers, such as one or more undoped GaAs layers, one or more p-doped semiconductor layers, such as one or more p-doped GaAs (p-GaAs) layers, and/or one or more n-doped semiconductor layers, such as one or more n-doped GaAs (n-GaAs) layers. The control layer 310 may be configured to be processed to form the control structure 312 (e.g., as described herein in relation to reference number 330).

As further shown in FIG. 3, after the MBE phase 325 has finished, the multiphase growth sequence may include a second transition period (e.g., a time after the MBE phase 325 and before a second MOCVD phase 335). For example, during the second transition period, the epitaxial structure formed by the first MOCVD phase 320 and/or the MBE phase 325 may be physically moved from the MBE processing environment to another MOCVD processing environment (e.g., that is the same as or different from the MOCVD processing environment described above).

As shown by reference number 330, during the second transition period, the multiphase growth sequence may include forming the control structure 312. For example, the multiphase growth sequence may include using a chemical etching process (e.g., on the control layer 310) to form the control structure 312. Accordingly, the control structure 312 may be formed to include a one-dimensional grating, a two-dimensional grating, a sub-wavelength grating (e.g., a sub-$\lambda$ grating), a diffuser, a round aperture, a polygonal-shaped aperture, and/or an elliptical aperture. In this way, the control structure 312 may be configured to provide mode code control within a cavity of the VCSEL device (e.g., as described herein in relation to FIG. 1). Additionally, or alternatively, the control structure 312 may be formed to include a buried tunnel junction. In this way, the control structure 312 may be configured to provide optical confinement and/or current confinement within the cavity of the VCSEL device (e.g., as described herein in relation to FIG. 2).

As further shown in FIG. 3, the multiphase growth sequence may include the second MOCVD phase 335. During the second MOCVD phase 335, a second MOCVD process may be used to form one or more layers of the epitaxial structure. For example, as shown in FIG. 3, the second MOCVD process may be used to form the second mirror 314 over the control structure 312 and/or the dielectric layer 316 over the second mirror 314. In some implementations, additional material (e.g., comprising one or more semiconductor material layers) may be formed (e.g., before forming the second mirror 314) on the control structure 312 (e.g., to fill in spaces between components, such as grating components, of the control structure 312). Accordingly, the additional material may be formed to create a flat surface (e.g., planar surface), on which the second mirror 314 may be formed. This increases a likelihood of forming a high-quality second mirror 314 and/or dielectric layer 316.

Accordingly, after the second MOCVD phase 335 has finished, the VCSEL device is formed (e.g., that includes the epitaxial structure formed by the first MOCVD phase 320, the MBE phase 325, and the second MOCVD phase 335).

As indicated above, FIG. 3 is provided as an example. Other examples may differ from what is described with regard to FIG. 3. In practice, the multiphase growth sequence may include forming additional layers and/or elements, fewer layers and/or elements, different layers and/or elements, or differently arranged layers and/or elements than those shown in FIG. 3.

Figure 4:
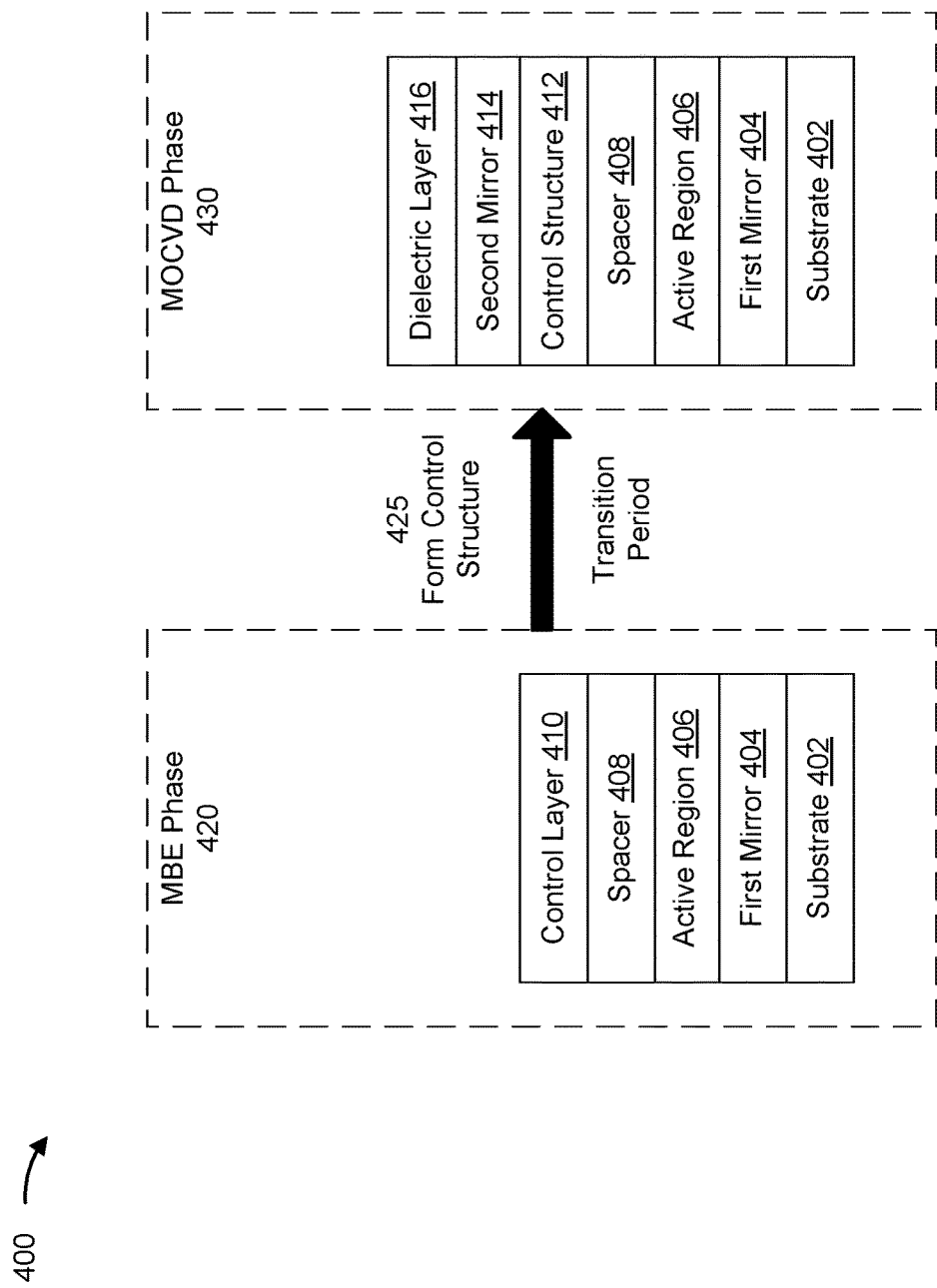
FIG. 4 is a diagram of another example implementation of a multiphase growth sequence for forming a VCSEL device.

FIG. 4 is a diagram of an example implementation 400 of a multiphase growth sequence for forming a VCSEL device (e.g., a VCSEL device that is the same as, or similar to, the VCSEL device 100 or the VCSEL device 200 described in relation to FIGS. 1-2). As shown in FIG. 4, the VCSEL device may be formed by forming a substrate 402, a first mirror 404, an active region 406, a spacer 408, a control layer 410, a control structure 412, a second mirror 414, and/or a dielectric layer 416. The substrate 402, the first mirror 404, the active region 406, the spacer 408, the control structure 412, the second mirror 414, and/or the dielectric layer 416 may be the same as, or similar to, corresponding structures and/or layers described herein in relation to FIGS. 1-2.

As shown in FIG. 4, the multiphase growth sequence may include an MBE phase 420. During the MBE phase 420, an MBE process may be used to form one or more layers of an epitaxial structure (e.g., that will become the VCSEL device). For example, as shown in FIG. 4, the MBE process may be used to form the first mirror 404 over the substrate 402, the active region 406 over the first mirror 404, the spacer 408 over the active region 406, and/or the control layer 410 over the spacer 408. The control layer 410 may include one or more undoped semiconductor layers, such as one or more undoped GaAs layers, one or more p-doped semiconductor layers, such as one or more p-doped GaAs (p-GaAs) layers, and/or one or more n-doped semiconductor layers, such as one or more n-doped GaAs (n-GaAs) layers. The control layer 410 may be configured to be processed to form the control structure 412 (e.g., as described herein in relation to reference number 330).

As further shown in FIG. 4, after the MBE phase 420 has finished, the multiphase growth sequence may include a transition period (e.g., a time after the MBE phase 420 and before an MOCVD phase 430). For example, during the transition period, the epitaxial structure formed by the MBE phase 420 may be physically moved from an MBE processing environment (e.g., that is during the MBE phase 420) to an MOCVD processing environment (e.g., that is used during the MOCVD phase 430).

As shown by reference number 425, during the transition period, the multiphase growth sequence may include forming the control structure 412. For example, the multiphase growth sequence may include using a chemical etching process (e.g., on the control layer 410) to form the control structure 412. Accordingly, the control structure 412 may be formed to include a one-dimensional grating, a two-dimensional grating, a sub-wavelength grating (e.g., a sub-$\lambda$ grating), a diffuser, a round aperture, a polygonal-shaped aperture, and/or an elliptical aperture. In this way, the control structure 412 may be configured to provide mode code control within a cavity of the VCSEL device (e.g., as described herein in relation to FIG. 1). Additionally, or alternatively, the control structure 412 may be formed to include a buried tunnel junction. In this way, the control structure 412 may be configured to provide optical confinement and/or current confinement within the cavity of the VCSEL device (e.g., as described herein in relation to FIG. 2).

As further shown in FIG. 4, the multiphase growth sequence may include the MOCVD phase 430. During the MOCVD phase 430, an MOCVD process may be used to form one or more layers of the epitaxial structure. For example, as shown in FIG. 4, the MOCVD process may be used to form the second mirror 414 over the control structure 412 and/or the dielectric layer 416 over the second mirror 414. In some implementations, additional material (e.g., comprising one or more semiconductor material layers) may be formed (e.g., before forming the second mirror 414) on the control structure 412 (e.g., to fill in spaces between components, such as grating components, of the control structure 412). Accordingly, the additional material may be formed to create a flat surface (e.g., planar surface), on which the second mirror 414 may be formed. This increases a likelihood of forming a high-quality second mirror 414 and/or dielectric layer 416.

Accordingly, after the second MOCVD phase 430 has finished, the VCSEL device is formed (e.g., that includes the epitaxial structure formed by the MBE phase 420 and/or the MOCVD phase 430).

As indicated above, FIG. 4 is provided as an example. Other examples may differ from what is described with regard to FIG. 4. In practice, the multiphase growth sequence may include forming additional layers and/or elements, fewer layers and/or elements, different layers and/or elements, or differently arranged layers and/or elements than those shown in FIG. 4.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method of forming a vertical cavity surface emitting laser (VCSEL) device using a multiphase growth sequence, comprising:
    forming, during a first metal-organic chemical vapor deposition (MOCVD) phase of the multiphase growth sequence, a first mirror over a substrate;
    forming an active region over the first mirror;
    forming a spacer on a surface of the active region,
        wherein the active region and the spacer are formed using a molecular beam epitaxy (MBE) process during an MBE phase of the multiphase growth sequence;
    forming a control structure on a surface of the spacer,
        wherein the control structure is configured to provide control of a mode within a cavity of the VCSEL device; and
    forming a second mirror over the control structure,
        wherein the second mirror is formed using an MOCVD process during a second MOCVD phase of the multiphase growth sequence, and
        wherein the control structure is formed using a chemical etching process during a transition period between the MBE phase and the second MOCVD phase of the multiphase growth sequence; and
    forming, during the second MOCVD phase of the multiphase growth sequence and using the MOCVD process, a dielectric layer over the second mirror.

2. The method of claim 1, wherein the VCSEL device is configured to emit an output beam,
    wherein the output beam is associated with a wavelength range of 1200-1600 nanometers.

3. The method of claim 1, wherein the VCSEL device comprises at least one of:
    a short-wave infrared (SWIR) VCSEL device;
    an oxide confined VCSEL device;
    an implant confined VCSEL device;
    a mesa confined VCSEL device;
    a top emitting VCSEL device; or
    a bottom emitting VCSEL device.

4. The method of claim 1, wherein the MBE phase occurs before the second MOCVD phase.

5. The method of claim 1, wherein the first mirror is formed on a surface of the substrate, and
   wherein the first mirror is an n-doped mirror and the substrate is an n-doped substrate.

6. The method of claim 1, wherein providing control of the mode causes the VCSEL device to at least one of:
   the VCSEL device to promote emission of an output beam associated with a first polarization mode; or
   the VCSEL device to attenuate emission of an output beam that is not associated with a second polarization mode.

7. The method of claim 1, wherein the spacer comprises a p-doped semiconductor layer formed on the surface of the active region.

8. A method of forming a vertical cavity surface emitting laser (VCSEL) device using a multiphase growth sequence, comprising:
   forming, using a first metal-organic chemical vapor deposition (MOCVD) process during a first MOCVD phase of the multiphase growth sequence, a first mirror over a substrate,
      wherein the first mirror is a distributed Bragg reflector (DBR);
   forming an active region over the first mirror;
   forming a spacer on a surface of the active region,
      wherein the active region and the spacer are formed using a molecular beam epitaxy (MBE) process during an MBE phase of the multiphase growth sequence;
   forming a control structure on a surface of the spacer; and
   forming a second mirror over the control structure,
      wherein the second mirror is formed using a second MOCVD process during a second MOCVD phase of the multiphase growth sequence,
      wherein the control structure is formed using a chemical etching process during a transition period between the MBE phase and the second MOCVD phase of the multiphase growth sequence, and
      wherein the control structure is configured to provide mode control within a cavity of the VCSEL device; and
   forming, during the second MOCVD phase of the multiphase growth sequence and using the MOCVD process, a dielectric layer over the second mirror.

9. The method of claim 8, wherein the control structure comprises at least one of:
   a one-dimensional grating;
   a two-dimensional grating;
   a sub-wavelength grating;
   a diffuser;
   a round aperture;
   a polygonal-shaped aperture; or
   an elliptical aperture.

10. The method of claim 8, wherein:
    the substrate comprises gallium arsenide (GaAs);
    the active region comprises at least one of a dilute nitride quantum well or an indium gallium arsenide (InGaAs) quantum dot layer;
    the spacer comprises a p-doped semiconductor layer; and
    the first mirror and the second mirror each comprise at least one of a GaAs layer or an aluminum gallium arsenide (AlGaAs) layer.

11. The method of claim 8, wherein:
    the first mirror is an n-doped distributed Bragg reflector (DBR); and
    the second mirror is a p-doped DBR.

12. The method of claim 8, wherein:
    the spacer comprises a p-doped semiconductor layer formed on the surface of the active region;
    the control structure is formed on the surface of the spacer; and
    the second mirror is a p-doped distributed Bragg reflector (DBR) formed on a surface of the control structure.

13. A method of forming a vertical cavity surface emitting laser (VCSEL) device using a multiphase growth sequence, comprising:
    forming, during a first metal-organic chemical vapor deposition (MOCVD) phase of the multiphase growth sequence, a first mirror over a substrate;
    forming an active region over the first mirror;
    forming a spacer on a surface of the active region;
    forming a control structure on a surface of the spacer;
    forming a second mirror over the control structure,
       wherein the active region, the spacer, and the control structure are formed using a molecular beam epitaxy (MBE) process during an MBE phase of the multiphase growth sequence,
       wherein the second mirror is formed using an MOCVD process during a second MOCVD phase of the multiphase growth sequence,
       wherein the control structure is further formed using a chemical etching process during a transition period between the MBE phase and the second MOCVD phase of the multiphase growth sequence, and
       wherein the control structure is configured to provide optical confinement and current confinement within a cavity of the VCSEL device; and
    forming, during the second MOCVD phase of the multiphase growth sequence and using the MOCVD process, a dielectric layer over the second mirror.

14. The method of claim 13, wherein the control structure comprises a buried tunnel junction.

15. The method of claim 13, wherein:
    the substrate comprises gallium arsenide (GaAs);
    the active region comprises at least one of a dilute nitride quantum well or an indium gallium arsenide (InGaAs) quantum dot layer;
    the spacer comprises a p-doped semiconductor layer;
    the control structure comprises an n-doped semiconductor layer; and
    the first mirror and the second mirror each comprise at least one of a GaAs layer or an aluminum gallium arsenide (AlGaAs) layer.

16. The method of claim 13, wherein:
    the first mirror is an n-doped distributed Bragg reflector (DBR); and
    the second mirror is an n-doped DBR.

17. The method of claim 13, wherein:
    the spacer comprises a p-doped semiconductor layer formed on the surface of the active region;
    the control structure comprises an n-doped semiconductor layer formed on the surface of the spacer; and
    the second mirror is an n-doped distributed Bragg reflector (DBR) formed on a surface of the control structure.

18. The method of claim 13, wherein the VCSEL device comprises at least one of:
    a short-wave infrared (SWIR) VCSEL device;
    an oxide confined VCSEL device;
    an implant confined VCSEL device;
    a mesa confined VCSEL device;
    a top emitting VCSEL device; or
    a bottom emitting VCSEL device.

19. The method of claim 13, wherein the MBE phase occurs before the second MOCVD phase.

20. The method of claim 13, wherein the first mirror is an n-doped mirror and the substrate is an n-doped substrate.

* * * * *